US012380263B2

(12) United States Patent
Lin et al.

(10) Patent No.: US 12,380,263 B2
(45) Date of Patent: Aug. 5, 2025

(54) METHOD FOR VIEWING SIMULATION SIGNALS OF DIGITAL PRODUCTS AND SIMULATION SYSTEM

(71) Applicant: SHENZHEN GUOWEIXIN TECHNOLOGY CO., LTD, Shenzhen (CN)

(72) Inventors: Kaipeng Lin, Guangdong (CN); Yanrong Li, Guangdong (CN); Xiaoli Huang, Guangdong (CN)

(73) Assignee: SHENZHEN GUOWEIXIN TECHNOLOGY CO., LTD, Guangdong (CN)

( * ) Notice: Subject to any disclaimer, the term of this patent is extended or adjusted under 35 U.S.C. 154(b) by 575 days.

(21) Appl. No.: 17/792,480

(22) PCT Filed: Mar. 25, 2020

(86) PCT No.: PCT/CN2020/081215
§ 371 (c)(1),
(2) Date: Jul. 13, 2022

(87) PCT Pub. No.: WO2021/109365
PCT Pub. Date: Jun. 10, 2021

(65) Prior Publication Data
US 2023/0057034 A1 Feb. 23, 2023

(30) Foreign Application Priority Data
Dec. 6, 2019 (CN) .......................... 201911244649.7

(51) Int. Cl.
G06F 30/343 (2020.01)
G06F 9/455 (2018.01)
(Continued)

(52) U.S. Cl.
CPC ........ *G06F 30/343* (2020.01); *G06F 30/3308* (2020.01); *G06F 30/3323* (2020.01);
(Continued)

(58) Field of Classification Search
CPC ............... G06F 30/343; G06F 30/3323; G06F 30/3308; G06F 30/367; G06F 30/331;
(Continued)

(56) References Cited

U.S. PATENT DOCUMENTS 5,937,179 A * 8/1999 Swoboda ................ G06F 30/33
703/23
RE36,904 E * 10/2000 Gates .................... G06F 13/385
710/52
(Continued)

FOREIGN PATENT DOCUMENTS

CN       1940944 A         4/2007
CN    100447796 C  * 12/2008  ..... G01R 31/318536
(Continued)

OTHER PUBLICATIONS

Chuang et al. ("Hybrid Approach to Faster Functional Verification with Full Visibility," IEEE Design & Test of Computers, Mar.-Apr. 2007, pp. 154-162). (Year: 2007).*
(Continued)

*Primary Examiner* — Phallaka Kik
(74) *Attorney, Agent, or Firm* — Troutman Pepper Locke LLP; Tim Tingkang Xia, Esq.

(57) ABSTRACT

The present invention discloses a method for viewing simulation signals of digital products and a simulation system, the method includes: when performing FPGA simulation on digital products, reading out all external port status data of digital products in real time and recording, meanwhile reading out all internal status data of digital products once every interval time and recording; after completing the
(Continued)

simulation, when needing a back trace to check the data of digital products in a certain clock cycle, reading out the internal status data of digital products stored at the last time point before this clock cycle and the external port status data at said time point in the recorded simulation data; and taking the read-out data as an initial status data of the FPGA, then reading out all internal status data of digital products clock by clock until running to the clock cycle that needs to be viewed.

5 Claims, 2 Drawing Sheets

(51) Int. Cl.
    *G06F 11/07*     (2006.01)
    *G06F 30/3308*     (2020.01)
    *G06F 30/331*     (2020.01)
    *G06F 30/3323*     (2020.01)
    *G06F 30/34*     (2020.01)
    *G06F 30/367*     (2020.01)
    *G06F 30/398*     (2020.01)

(52) U.S. Cl.
    CPC .............. *G06F 9/455* (2013.01); *G06F 11/07* (2013.01); *G06F 30/331* (2020.01); *G06F 30/34* (2020.01); *G06F 30/367* (2020.01); *G06F 30/398* (2020.01)

(58) Field of Classification Search
    CPC ........ G06F 30/34; G06F 30/398; G06F 9/455; G06F 11/0766
    USPC ...... 716/106, 111, 117, 136; 703/16, 17, 28; 714/33, 34, 39, 732, 741
    See application file for complete search history.

(56) References Cited

U.S. PATENT DOCUMENTS

| | | | | |
|---|---|---|---|---|
| 6,785,873 | B1 * | 8/2004 | Tseng | G06F 30/33 716/108 |
| 6,850,871 | B1 * | 2/2005 | Barford | G05B 17/02 703/2 |
| 8,843,861 | B2 * | 9/2014 | Selvidge | G06F 30/30 716/102 |
| 10,430,215 | B1 * | 10/2019 | Roy | G06F 9/455 |
| 10,664,637 | B2 * | 5/2020 | Krishnamurthy | G06F 30/331 |
| 10,740,521 | B1 * | 8/2020 | Chang | G06F 30/30 |
| 10,949,588 | B1 * | 3/2021 | Salz | G06F 30/331 |
| 2002/0152060 | A1 * | 10/2002 | Tseng | G06F 13/22 703/16 |
| 2003/0144828 | A1 * | 7/2003 | Lin | G06F 30/33 703/21 |
| 2011/0307233 | A1 * | 12/2011 | Tseng | G06F 30/347 703/21 |
| 2013/0318484 | A1 * | 11/2013 | Selvidge | G06F 30/3308 716/102 |
| 2014/0100841 | A1 * | 4/2014 | Bures | G06F 30/331 703/28 |
| 2017/0185710 | A1 * | 6/2017 | Suresh | G06F 30/331 |
| 2021/0173989 | A1 * | 6/2021 | Lin | G06F 30/331 |
| 2021/0173994 | A1 * | 6/2021 | Lin | G06F 30/343 |

FOREIGN PATENT DOCUMENTS

| | | | | |
|---|---|---|---|---|
| CN | 107066670 | A * | 8/2017 | ......... G06F 17/5054 |
| CN | 110765711 | A * | 2/2020 | ......... G06F 30/331 |
| CN | 110765716 | A * | 2/2020 | ......... G06F 30/3312 |

OTHER PUBLICATIONS

International Search Report of PCT/CN2020/081215, Sep. 11, 2020.

* cited by examiner

METHOD FOR VIEWING SIMULATION SIGNALS OF DIGITAL PRODUCTS AND SIMULATION SYSTEM

FIELD OF THE INVENTION

The present invention relates to the technical field of simulation of digital logic products, in particular to a method for viewing simulation signals of digital products and a simulation system.

BACKGROUND OF THE INVENTION

In the design process of digital logic products, it is necessary to test and verify the correctness of the design through a step of simulation verification, which is generally enabled by a software simulator (Simulator).

The operation principle of the software simulator is to run the design to be tested (RTL code or gate-level netlist) and the test vector (HVL code or non-synthesizable System Verilog program) in the simulator, and interact with the interface signal of the design to be tested and the test vector, so as to complete the verification flow defined in the test vector. Developers can confirm the correctness of the design, as well as the Debug, by checking the value of any test vector, and viewing the value of any port or internal signal of the design to be tested, or the waveform composed of multiple clock cycles.

However, the performance of the software emulator, subject to the software processing capability, is very limited. Generally, only a few tens of Hz may be required to run for verifying a complete design of a SoC. Therefore, in order to accelerate running, designers tend to transplant the design to the FPGA for verification as fast as possible. This verification method is generally called FPGA Prototyping Verification, which can reach a running speed of tens of MHz or an even higher speed, and enable faster verification.

However, it is difficult for the FPGA Prototyping Verification to detect the signal value of the design to be tested, instead generally only to count on the required signal to be led to the port through wiring, and then connected to the logic analyzer for triggering or displaying. This detection method is called a static probe, which can only detect a very limited number of signals, and needs to rewire the FPGA at every detecting a new signal with the necessity of a long preparation time. Moreover, in this process, due to changes in the signal or environment, it may be difficult to reproduce the original error or event that occurred, so the FPGA has very poor debuggability.

Considering the obvious advantages and disadvantages of the software simulator and the FPGA prototyping verification, in the industry, people prefer a solution that enables the simulation verification process to possess the full visibility of the software simulator and the rapidity of the FPGA prototyping verification. This solution is called a hardware emulator (Emulator) in the industry. The hardware emulator has two important properties as follows. Performance: Compared with the software emulator, the hardware emulator has obvious advantages. In general, the hardware emulator runs at a MHz-level speed.

Signal detectability: Compared to the FPGA prototyping verification, the hardware emulator has such good signal detectability that all internal and port signals of the design to be tested can be viewed without re-running or reconfiguration. What mentioned as above is called the Full Visibility as a technical term.

In order to actualize the hardware emulator, several technical solutions were provided as follows. The software emulator runs in parallel, by using a distributed array of dedicated processors, which is equivalent to a super-large-scale processor cluster. All signals are stored in a external memory through additional signal channels and additional routing resources, by adopting a customized FPGA. The commonly used FPGA is adopted to form an array, so as to read out and store the signals to the external memory, by means of the storage and transference to the external memory by cloning shadow resources, or the read-out and write-in capability of the scanning chain provided by the FPGA.

The array of dedicated processors has the advantage, such as very strong signal detection capability, but the disadvantage, such as very slow running speed, very large power consumption, and very high upgrade costs arising from the investment required to develop a dedicated processor ASIC. The customized FPGA array has the advantage, such as fast running, but the disadvantage, such as high upgrade costs arising from the investment required to develop a customized FPGA. The commonly used FPGA array has the advantage, such as high speed and low costs, but the disadvantage, such as poor signal detection capability.

In the technical solution of the commonly used FPGA array, there are generally two methods to achieve the full visibility.

Cloning shadow resources: All trigger signals of the signal to be tested are output to a shadow register, and then transferred to the external memory one by one through dedicated logic. The combined signal is deduced from the trigger signal at the later stage of the software. This method basically does not slow down the running speed of the design to be tested, and consumes a lot of shadow logic, resulting in very low (as low as <30%) FPGA resources available to the logic to be tested. Meanwhile, when the signals need to be displayed after operation, it will take a lot of the preparation time to display signals, as it needs to recalculate the combinational logic.

Read-out and write-in resources of the scanning chain provided by the FPGA: FPGA manufacturers all provide read-out/write-in channels for internal resources, which can directly read out or write in the logic such as registers (DFF), logic resources (LUT), and built-in SRAM (BRAM) in additional channels except ordinary logic resource network (it can be understood as a signal channel from God's perspective), for example, XILINX calls this function as Configuration Readback Capture. This channel is generally used for FPGA configuration, but the hardware emulator can also use this channel to read out any internal signal. This method is called Dynamic Probe Detection Method, which does not consume FPGA resources, but, as data is read out from a channel by scanning chains in a serial reading mode, this method has an extremely low speed, if this channel is used for reading, the running speed is as low as the Hz level. Therefore, the common hardware emulator only uses a dynamic probe to fetch a single signal value, when it is used to continuously fetch signals, the operation speed will decrease to a very low level.

SUMMARY OF THE INVENTION

In view of the technical problem, such as a low speed and a time-consuming process arising from the full visibility effectuated by the commonly used FPGA in the above-mentioned prior art, the objective of the present invention is to provide a method for viewing simulation signals of digital products and a simulation system, which enable a quick back trace to view all simulation data for any clock cycle.

In an embodiment of the present invention, a method for viewing simulation signals of digital products is provided, comprising:

when performing FPGA simulation on digital products, reading out all external port status data of digital products in real time and recording, meanwhile reading out all internal status data of digital products once every interval time and recording;

after completing the simulation, when needing a back trace to check the data of digital products in a certain clock cycle, reading out the internal status data of digital products stored at the last time point before this clock cycle and the external port status data at the time point in the recorded simulation data; and loading the digital products into a FPGA, setting the external port status data and the internal status data recorded at the time point as an initial status data of digital products, starting the FPGA to run and read out all internal status data of digital products clock by clock until running to the clock cycle that needs to be viewed.

In an embodiment of the present invention, when the external port status data and the internal status data of digital products are recorded, the serial number of the clock cycle is taken as a timestamp to store the external port status data and the internal status data of the digital products as ordered structured data.

In an embodiment of the present invention, a static probe detection method is adopted to read out all external port status data of digital products.

In an embodiment of the present invention, a dynamic probe detection method is adopted to read out all internal status data of digital products.

In an embodiment of the present invention, when reading out all internal status data of digital products once every interval time, the interval time is the same every times.

In an embodiment of the present invention, each interval time is 1 million clock cycles.

In an embodiment of the present invention, when reading out all internal status data of digital products once every interval time, the interval time may be different every times.

In an embodiment of the present invention, a simulation system of digital products is further provided, comprising an FPGA, a controller, and a storage device, the FPGA is used to load digital products and perform simulation verification;

the controller is used to read out all external port status data of digital products in real time, and read out all internal status data of digital products once every interval time, when performing FPGA simulation on the digital products;

the storage device is used to store the simulation data read out by the controller;

after completing the simulation, when needing a back trace to check the data of digital products in a certain clock cycle, the controller reads out the internal status data of digital products recorded at the last time point before this clock cycle and the external port status data at the time point in the simulation data recorded in the storage device, then the controller loads the digital products into the FPGA, sets the external port status data and the internal status data recorded at the time point as an initial status data of digital products, starts the FPGA to run and read out all internal status data of digital products clock by clock until it runs to the clock cycle that needs to be viewed.

In an embodiment of the present invention, after the controller has read out the external port status data and the internal status data of digital products, it takes the serial number of the clock cycle as a timestamp to store the external port data and the internal status data of digital products as ordered structured data and stores them in the storage device.

In an embodiment of the present invention, the controller adopts a static probe detection method to read out all external port status data of digital products, and adopts a dynamic probe detection method to read out all internal status data of digital products.

Compared with the prior art, in the method for viewing simulation signals of digital products and the simulation system according to the present invention, when FPGA simulation is performed on digital products, all external port status data of digital products is read and recorded in real time, meanwhile all internal status data of digital products is read and recorded at regular intervals. After the simulation is completed, when a back trace is required to check the data of digital products in a certain clock cycle, the internal status data of digital products stored at the last time point before this clock cycle and the external port status data at this time point are read out in the recorded simulation data, then the read-out external status data and internal status data are written into the digital products, so that the digital products start to run with these status data serving as the initial operation state, and then use a dynamic probe to record all internal status data of digital products clock by clock until it runs to the clock cycle that needs to be viewed, that is, the data of the clock cycle can be obtained for viewing, so the method and system can save the running time of the FPGA before this time point, thereby saving the time for viewing the data.

DETAILED DESCRIPTION OF SOME EMBODIMENTS

Figure 1:
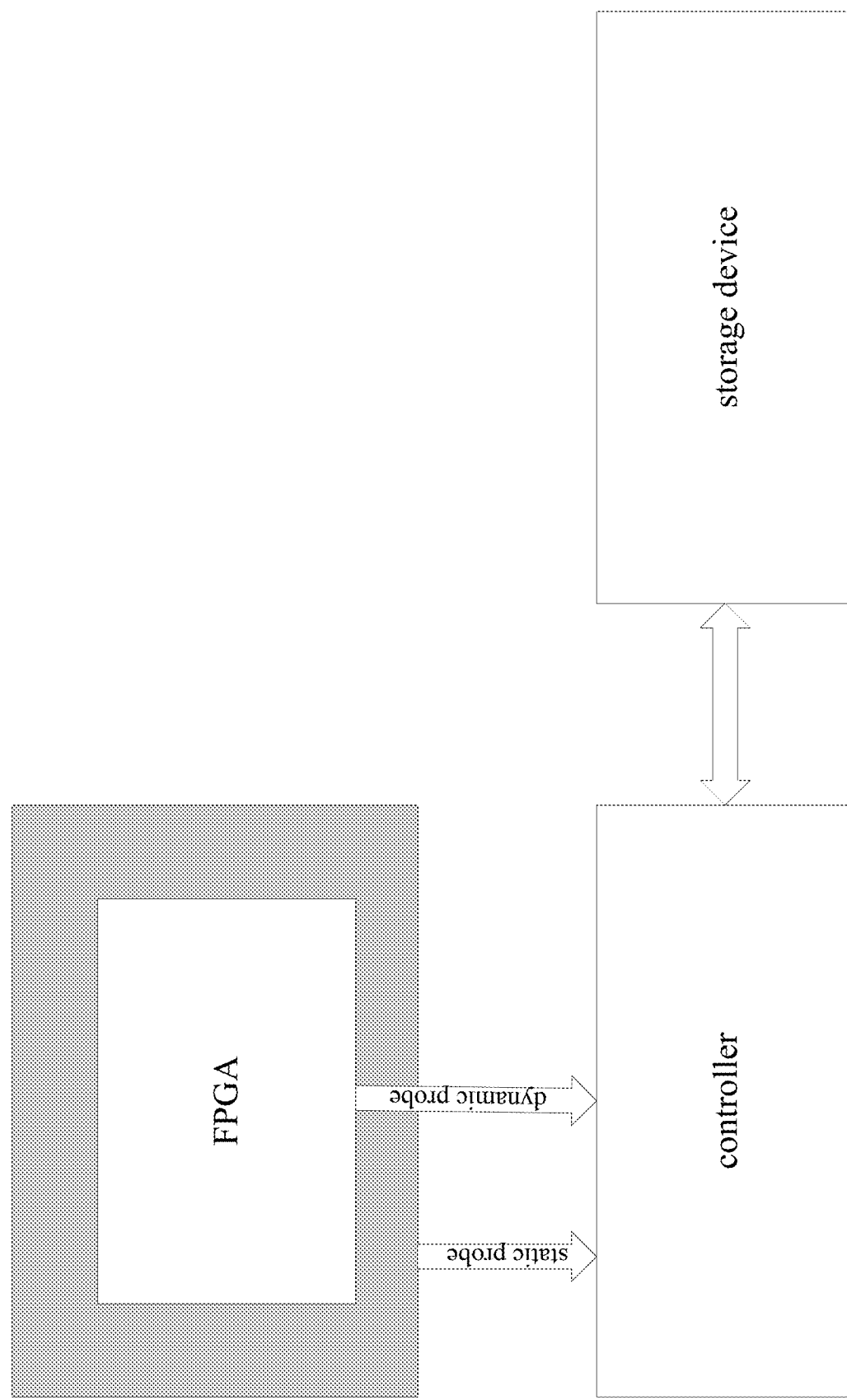
FIG. 1 is a structure diagram of the simulation system of digital products according to the present invention.

As shown in FIG. 1, an embodiment of the present invention provides a simulation system of digital products, which includes an FPGA, a controller, and a storage device. The FPGA is used to load digital products and perform simulation verification. The controller is used to read out the simulation data of the FPGA, and the storage device is used to store the simulation data of the FPGA.

Figure 2:
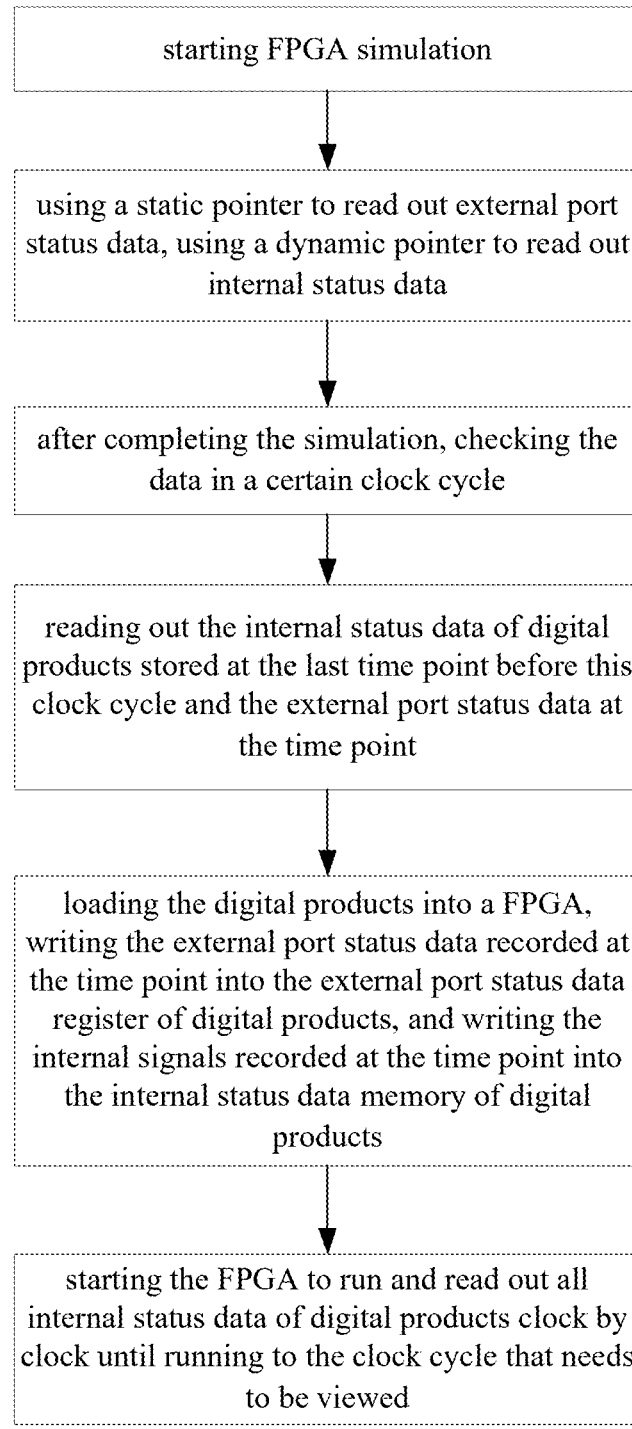
FIG. 2 is a flow chart of the method for viewing simulation signals of digital products according to the present invention.

As shown in FIG. 2, when FPGA simulation is performed on digital products, the controller adopts a static probe detection method to read out all external port status data of digital products in real time, meanwhile the controller adopts a dynamic probe detection method to read out all internal status data of digital products once every interval time. At the same time, the controller takes the serial number of the clock cycle as a timestamp to store the external port data and the internal status data of digital products as ordered structured data and stores them in the storage device. The stored data includes the serial number of the clock cycle taken as a time stamp, so that the data corresponding to the clock cycle can be queried at a subsequent data query.

It should be noted that, when FPGA simulation is performed on digital products, initial operating parameters can just be set after loading digital products to the FPGA. When reading out all external port status data of digital products, the static probe detection method is adopted, the external ports have been led out by lead wires, so they can be directly read in real time without any delay. When reading out all internal status data of digital products, as the dynamic probe detection method is adopted, data is read out from a channel by scanning chains in a serial reading mode, with an extremely lower speed, so it takes a lot of time to read out all internal status data of digital products every time. Therefore, it is not possible to read all internal status data of the digital product in real time, instead to read all internal status data of the digital product once every interval time.

When reading out all internal status data of digital products once every interval time, the interval time is the same every times, for example, the interval time can be set to be 1 million clock cycles every times. When reading out all internal status data of digital products once every interval time, the interval time may be different every times, for example, in the early stage of the simulation, the interval time may be set larger, such as 10 million clock cycles; in the later stage of the simulation, the interval time may be set smaller, such as 1 million clock cycles.

After completing the simulation, when users need a back trace to check the data of digital products in a certain clock cycle, the controller reads out the internal status data of digital products stored at the last time point before this clock cycle and the external port status data at this time point in the recorded simulation data. Then, the digital products are loaded into the FPGA, the external port status data recorded at the time point is written into the external port status data register of digital products, and the internal signals recorded at the time point are written into the internal status data memory of digital products. The internal status data memory of digital products includes a built-in register (DFF), a logic resource (LUT) and a built-in SRAM (BRAM).

Then, the FPGA simulation is started, so that the digital products start to run with these status data serving as the initial operation state, and then adopt the dynamic probe detection method to record all internal status data of digital products clock by clock until it runs to the clock cycle that needs to be viewed, that is, the data of the clock cycle can be obtained for viewing, so the method and system can save the running time of the FPGA before this time point, thereby saving the time for viewing the data.

In summary, in the method and system for viewing simulation signals of digital products according to the present invention, when FPGA simulation is performed on digital products, all external port status data of digital products is read and recorded in real time, meanwhile all internal status data of digital products is read and recorded at regular intervals. After the simulation is completed, when a back trace is required to check the data of digital products in a certain clock cycle, the internal status data of digital products stored at the last time point before this clock cycle and the external port status data at this time point are read out in the recorded simulation data, then the read-out external status data and internal status data are written into the digital products, so that the digital products start to run with these status data serving as the initial operation state, and then use a dynamic probe to record all internal status data of digital products clock by clock until it runs to the clock cycle that needs to be viewed, that is, the data of the clock cycle can be obtained for viewing, so the method and system can save the running time of the FPGA before this time point, thereby saving the time for viewing the data.

The above description is only a preferred embodiment of the present invention, not intended to limit the present invention. Any modifications, equivalent replacements and improvements made within the spirit and principle of the present invention shall fall within the protection scope of the present invention.

What is claimed is:

1. A method for viewing simulation signals of digital products, comprising:
    when performing FPGA simulation on said digital products, reading out all external port status data of said digital products in real time by adopting a dynamic probe detection method and recording the external port status data being read out in real time as simulation data, and reading out all internal status data of said digital products once every interval time by adopting a static probe detection method and recording the internal status data being read out once every interval time as part of the simulation data;
    after completing the FPGA simulation, when needing a back trace to check the data of digital products in a certain clock cycle, reading out the internal status data of digital products recorded at a last time point before this clock cycle and the external port status data at said time point in the recorded simulation data; and
    loading said digital products into a FPGA, setting the external port status data and the internal status data recorded at said time point as an initial status data of digital products, starting said FPGA to run and read out all internal status data of digital products clock by clock until running to a clock cycle that needs to be viewed;
    wherein when the external port status data and the internal status data of digital products are recorded, a serial number of the clock cycle is taken as a timestamp to store the external port status data and the internal status data of digital products as ordered structured data.

2. The method for viewing simulation signals of digital products according claim 1, wherein when reading out all internal status data of digital products once every interval time, the interval time is the same every time.

3. The method for viewing simulation signals of digital products according claim 2, wherein each interval time is 1 million clock cycles.

4. The method for viewing simulation signals of digital products according claim 1, wherein when reading out all internal status data of digital products once every interval time, the interval time is different every times.

5. A simulation system of digital products for viewing simulation signals of said digital products, comprising:
    an FPGA configured to load said digital products and perform simulation verification;
    a controller configured to read out simulation data comprising all external port status data of digital products in real time by adopting a dynamic probe detection method, and all internal status data of digital products once every interval time by adopting a static probe detection method, when said FPGA is performing simulation on said digital products; and
    a storage device configured to record and store the simulation data read out by said controller;
    wherein said controller is further configured, after completing the simulation, when needing a back trace to check the simulation data of said digital products in a certain clock cycle, to read out the internal status data of said digital products recorded at a last time point before the certain clock cycle and the external port status data at said last time point in the simulation data recorded in said storage device, then said controller is configured to load said digital products into said FPGA, set the external port status data and the internal status data recorded at said time point as an initial status data of said digital products, start said FPGA to run and read out all internal status data of said digital products clock by clock until said FPGA runs to a clock cycle that needs to be viewed;

wherein after said controller has read out the external port status data and the internal status data of digital products, the controller is configured to take a serial number of the clock cycle as a timestamp to store the external port data and the internal status data of digital products as ordered structured data and stores them in said storage device.

* * * * *